(12) United States Patent
Hedayat et al.

(10) Patent No.: US 7,480,852 B2
(45) Date of Patent: Jan. 20, 2009

(54) METHOD AND SYSTEM FOR IMPROVING DECODING EFFICIENCY IN WIRELESS RECEIVERS

(75) Inventors: Ahmadreza Hedayat, Allen, TX (US); Hanqing Lou, Plano, TX (US); Hang Jin, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/766,078

(22) Filed: Jun. 20, 2007

(65) Prior Publication Data

US 2008/0092025 A1 Apr. 17, 2008

Related U.S. Application Data

(60) Provisional application No. 60/851,417, filed on Oct. 13, 2006.

(51) Int. Cl.
*H03M 13/03* (2006.01)
(52) U.S. Cl. .................. 714/794; 714/795; 714/796; 375/262; 375/341
(58) Field of Classification Search .............. 714/752, 714/786, 792, 794–796; 375/262, 341
See application file for complete search history.

(56) References Cited

U.S. PATENT DOCUMENTS

| 5,432,803 | A | * | 7/1995 | Liu et al. ............... 714/794 |
| 5,684,832 | A | * | 11/1997 | Adachi et al. ............ 375/262 |
| 5,887,007 | A | * | 3/1999 | Iwata et al. ............. 714/795 |
| 6,301,314 | B1 | * | 10/2001 | Murayama ............... 375/341 |
| 6,581,182 | B1 | * | 6/2003 | Lee ....................... 714/795 |
| 2006/0067436 | A1 | * | 3/2006 | Potkonjak et al. ......... 375/341 |

* cited by examiner

*Primary Examiner*—Esaw T Abraham
(74) *Attorney, Agent, or Firm*—Edell, Shapiro & Finnan, LLC (57) ABSTRACT

Techniques are provided herein to improve the decoding efficiency in a wireless receiver to obtain a correctly decoded data string. A state metric matrix from a received codeword is used to generate active state metric matrices for time instances of the received codeword, and then a differential metric matrix is generated from information in the active state metric matrices. Based on the differential metric matrix a maximum likelihood path and one or more alternative paths are identified. A first decoded data string corresponding to the maximum likelihood path and a plurality of second decoded data strings corresponding to the one or more alternative paths are derived. Integrity of the respective decoded data strings is examined to obtain the correct decoded data string based on the first and second decoded data strings.

20 Claims, 7 Drawing Sheets

METHOD AND SYSTEM FOR IMPROVING DECODING EFFICIENCY IN WIRELESS RECEIVERS

CROSS REFERENCE

The present application claims the benefit of U.S. Provisional Application Ser. 60/851,417, which was filed on Oct. 13, 2006.

BACKGROUND

Trellis codes, such as convolutional codes, trellis and bit-interleaved coded modulations, are commonly used to improve the performance of communications networks. However, a decoded message obtained by a receiver might still contain errors as a result of the impairment of channel conditions and/or insufficient protection due to a low redundancy rate.

Data exchanged in a wireless communications network is typically protected by an error detection code (EDC). A commonly used EDC algorithm is a cyclic redundancy code (CRC), which pads parity bits to the data. The EDC encoded data subsequently passes through a multi-state convolutional code encoder with a code rate of k/n. A convolutional code is terminated by a zero-padding or a tail-biting technique. In general, a convolutional code has a code rate of k/n; however, it is more practical to use a convolutional code with a code rate of 1/n in order to obtain higher rates through puncturing methods.

The decoding system of a receiver in a wireless communications network comprises a convolutional code decoder (e.g. a Maximum Likelihood decoder employing the Viterbi algorithm) and an EDC decoder. The EDC decoder examines the data decoded by the convolutional decoder to determine if a CRC error exists. Conventional methods for decoding messages may not always yield desired results or may use a considerable amount of time and resources due to the impairment of channel conditions and/or insufficient protection.

As such, what is desired is a method and system for improving decoding efficiency in a wireless communications network.

SUMMARY

The present invention discloses a method and system for improving the decoding efficiency in a wireless receiver to obtain a correct decoded data string. The method comprises generating an active state metric matrix of a receiving codeword, calculating a differential metric matrix pertinent to the active state metric matrix, identifying a maximum likelihood path and one or more alternative paths based on the differential metric matrix, deriving first decoded data string corresponding to the maximum likelihood path, deriving a plurality of second decoded data strings corresponding to the one or more alternative paths respectively, examining the integrity of the first decoded data string; and examining the integrity of the plurality of second decoded data strings after the first decoded data string is determined erroneous, wherein the wireless receiver obtains the correct decoded data string.

The construction and method of operation of the invention, however, together with additional objects and advantages thereof, will be best understood from the following description of specific embodiments when read in connection with the accompanying drawings.

BRIEF DESCRIPTION OF THE DRAWINGS

The drawings accompanying and forming part of this specification are included to depict certain aspects of the invention. The invention may be better understood by reference to one or more of these drawings in combination with the description presented herein. It should be noted that the features illustrated in the drawings are not necessarily drawn to scale.

DESCRIPTION

The following detailed description of the invention refers to the accompanying drawings. The description includes exemplary embodiments, not excluding other embodiments, and changes may be made to the embodiments described without departing from the spirit and scope of the invention. The following detailed description does not limit the invention. Instead, the scope of the invention is defined by the appended claims.

The present invention discloses a method for improving the performance of a decoding system in which a Maximum Likelihood (ML) decoder and an error detection code (EDC) decoder are used to attain data efficiently by reconstructing receiving codewords. A decoding system employing the disclosed method requires fewer system resources than those using conventional methods and attains data more efficiently by generating multiple alternative codewords. For example, the improvement in coding gain is more than 1 dB for an additive white Gaussian noise (AWGN) channel and about 1 to 2 dBs for a fading channel. In addition, there is substantial coding gain when multiple codewords are encoded with a convolutional code and protected by a single EDC.

In one embodiment of the present invention, a decoding system comprises an s-sate ML decoder for codewords of length l, i.e. there are l time instances in a trellis. The decoding process creates a state metric matrix SM of size s×l. The ML decoder processes receiving codewords, constructs a simplified trellis diagram from time instances $t_1$ to $t_l$, and generates a state metric matrix (SM) and potential maximum likelihood paths. The state metric matrix (SM) holds the metrics of the states of all time instances. In other words, each element of an SM represents the state metric of a time instance computed according to the Viterbi algorithm.

Out of all the states of a time instance, q states are selected as active states, where q is determined according to a predetermined rule. An active state metric matrix (ASM) of size q×2 keeps the active state metrics of two consecutive time instances. The q×2 ASM has two columns. Assuming that the current time instance is t, the first and second columns reflect the active state metrics of t−1 and t, respectively. The indices of q active states of the current time instance t are stored in an active state list A.

A path history matrix P of size q×l keeps the path history of all the potential ML paths during the decoding process. The metrics of all possible paths that go through an active state at a time instance are calculated. The difference between the metrics of the most reliable and the second most reliable paths is stored in the corresponding element of a differential metric matrix Δ of size q×l. Subsequently, a divergence list D of size c is generated using the differential metric matrix Δ. and it is used to construct alternative codewords.

Figure 1:
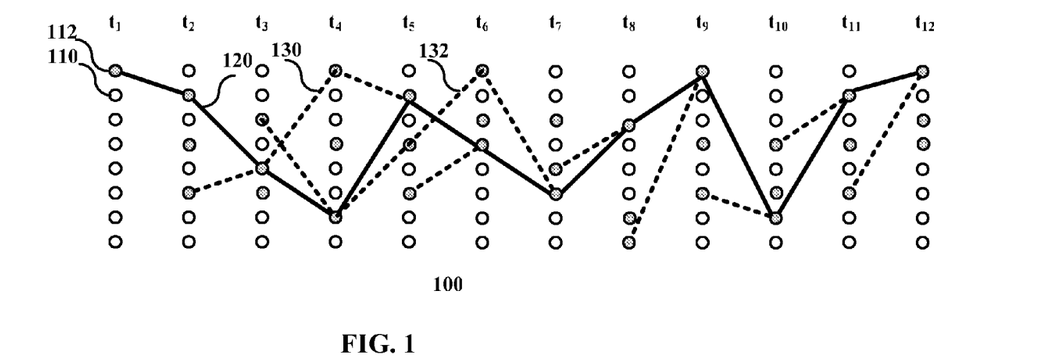
FIG. 1 is a simplified trellis diagram illustrating the decoding process of an eight-state trellis code employing the Viterbi algorithm.

FIG. 1 is a simplified trellis diagram illustrating the decoding process of an eight-state trellis code employing the Viterbi algorithm in accordance with an embodiment of the present invention. A column represents a time instance $t_i$. A circle represents a state 110 of the ML decoder at a time instance while a shaded circle represents an active state 112 of the ML decoder at a time instance. A solid line represents an ML path 120 while a dotted line illustrates alternative paths 130 and 132.

Based on state metric matrix information generated in the decoding process, an ML decoder employing a trace-back algorithm identifies a path representing the receiving codeword as an ML path. An alternative path, which also represents the receiving codeword, follows the ML path for a period of time, diverges from it at time instance i, and merges with it at time instance j, where i<j.

As shown in FIG. 1, an alternative path 130 from time instances $t_1$ to $t_{12}$ diverges from the ML path 120 in the $5^{nd}$ state at time instance $t_3$, and merges with it in the $2^{th}$ state at time instance $t_5$. Another alternative path 132 from time instances $t_1$ to $t_{12}$ diverges from the ML path 120 in the $6^{th}$ state at time instance $t_7$ and merges with it in the $7^{th}$ state at time instance $t_4$.

Figure 2:
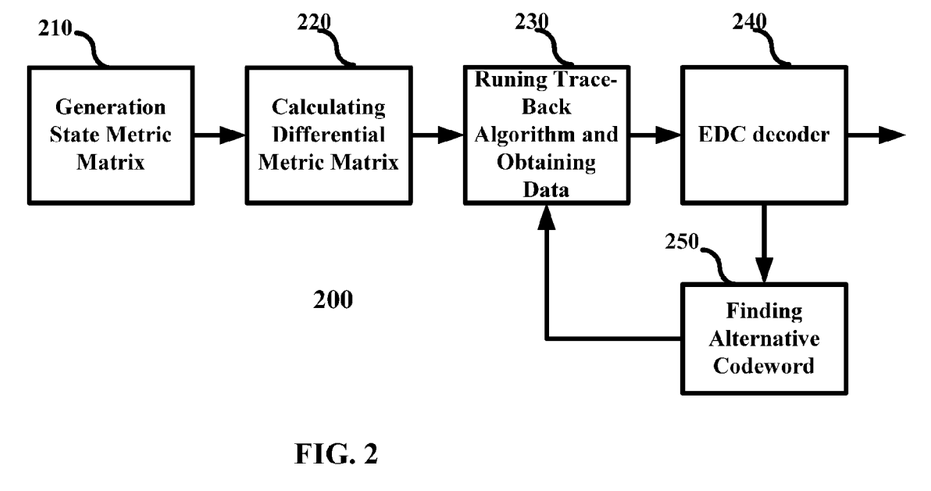
FIG. 2 illustrates a method for improving decoding efficiency in accordance with an embodiment of the present invention.

FIG. 2 illustrates a method 200 for improving decoding efficiency in accordance with an embodiment of the present invention. In step 210, the ML decoder processes a receiving codeword, computes the state metrics, and generates an active state metric matrix (ASM), a path history matrix P, and an active state list A for each time instance.

At any time instance t, a q×2 ASM has two columns. The $1^{st}$ column (the preceding time instance column) represents the active state metrics of t−1, and the $2^{nd}$ column (the current time instance column) represents the active state metrics of the current time t.

The metrics of all s-states at a time instance are computed, and q states with the most reliable metrics are identified, where q is determined according to a predetermined rule. These q states are considered as the active states of the current time instance. The metrics of the q states are stored in the $2^{nd}$ column of the ASM, namely the current time instance column.

The indices of the q active states of the current time instance are stored in a temporary table T1 while those of the q active states of the preceding time instance are stored in another temporary table T2. The elements of the temporary table T2 are inserted into the current time instance column in a path history matrix P. The elements of the temporary table T2 are stored in an active list A.

The active state metrics of all succeeding time instances are generated in the same way as described below. First, the active state metrics of the current time instance column are shifted from the $2^{nd}$ column to the $1^{st}$ column. Second, the active state metrics of the succeeding time instance are calculated based on the active state metrics of the current time instance. In other words, the active state metrics of the current time instance become the active state metrics of the preceding time instance in relation to the succeeding time instance. For example, three consecutive time instances are denoted as x, y, and z. In the case of y being the current time, the $1^{st}$ column in the ASM represents the active state metrics of time instance x; the $2^{nd}$ column represents those of time instance y. In the case of z being the current time, the $1^{st}$ column in the ASM represents the active state metrics of time instance y; the $2^{nd}$ column represents those of time instance z.

Step 220 shows the generating of a differential metric matrix Δ by the ML decoder. First, the metrics of all possible paths going through each state of a time instance are calculated. Second, for each state, the path with the most reliable metric is designated as the surviving path while the path with the second most reliable metric is designated as the best alternative path. Lastly, the difference between the metrics of the surviving path and the best alternative path of each state is stored in a differential metric matrix Δ.

In the case that some active states of the current time instance are related to only one active state of the preceding time instance, the metrics of the elements of the current time instance in the differential metric matrix that do not have corresponding elements in the preceding time instances are set to a predetermined maximum value. The reason for choosing a maximum value is that no alternative path passes through the active state of the current time instance.

In step 230, the receiving codeword is processed and a trace-back algorithm is executed to identify an ML path and generate a divergence list D, as shown. The information about the ML path is used to obtain a code sequence that represents the decoded codeword, which is subsequently converted to the decoded data.

The state metrics in the differential metric matrix Δ, related to the ML path, are examined. The indices of a predetermined number (c) of active states with the smallest metrics related to the ML path are retrieved, ordered and stored in a divergence list D, which is used to facilitate the construction of alternative codewords.

In step 240, the decoded data is received and the EDC decoder checks for errors. If no error exists, the data is sent to the next processing unit of the receiving chain of the wireless receiver. If, however, an error is detected, a technique for finding alternative codewords is employed.

Step 250 shows the process of finding an alternative codeword. Constructing an alternative codeword begins with choosing one element from the divergence list D; namely an index. A trace-back algorithm re-traces an alternative path starting from the active state that corresponds to the chosen index. The trace-back process continues until the alternative path converges with the original ML path. During the process of generating an alternative codeword, a portion of the original ML code sequence is replaced with a segment of an alternative code sequence, which results in an alternative codeword. The alternative codeword is fed to the EDC decoder to check for errors. The process, which includes generating an alternative codeword, sending the alternative data to the EDC decoder, and checking for errors, continues until correct data is obtained or all c alternative codewords generated from the divergence list D are examined and deemed corrupted.

Figure 3:
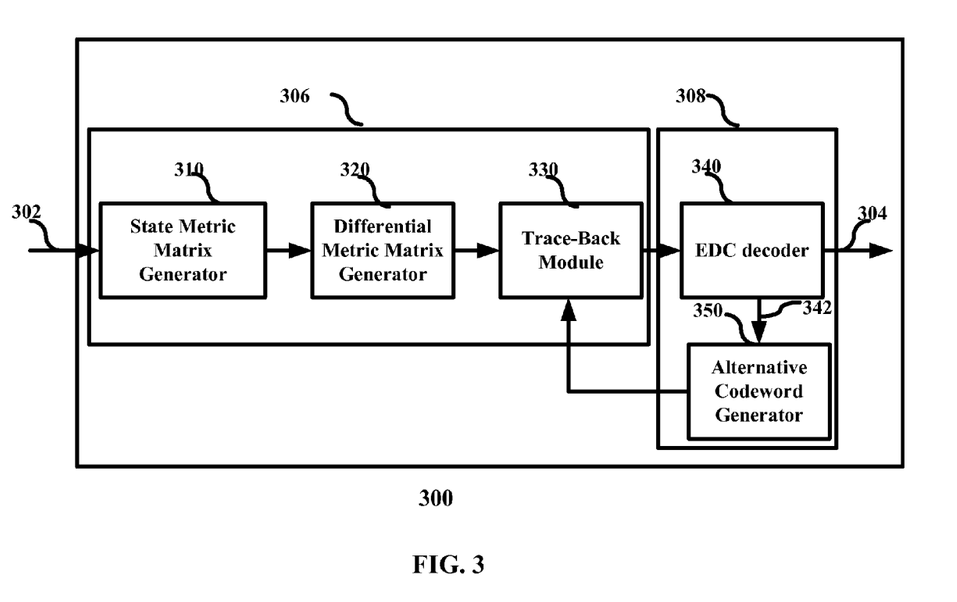
FIG. 3 illustrates a decoding system that employs an ML decoder and an EDC decoder to decode zero-padding trellis codes in accordance with an embodiment of the present invention.

The present invention builds on two common approaches for terminating the trellis of a trellis code: zero-padding and tail-biting. FIG. 3 illustrates a decoding system 300 that employs an ML decoder and an EDC decoder to decode zero-padding trellis codes in accordance with an embodiment of the present invention. The decoding system 300 comprises a state metric matrix generator 310, a differential metric matrix generator 320, a trace-back module 330, an EDC decoder 340, and an alternative codeword generator 350.

Three components of the decoding system 300 (the state metric matrix generator 310, the differential metric matrix generator 320, and the trace-back module 330) form a codeword-decoding module 306. The other two components (the EDC decoder 340 and the alternative codeword generator 350) form a data-checking module 308.

An input bit stream 302 represents a receiving codeword. Following the process described in step 210 of FIG. 2, the state metric matrix generator 310 processes the entire bit stream 302, calculates the state metrics of all time instances, and generates an active state metric matrix (ASM), a path history matrix P, and an active state list A. Based on the ASM, the differential metric matrix generator 320 calculates a differential metric matrix $\Delta$ and a divergence list D following the process described in step 220.

After the receiving codeword is processed, the trace-back module 330 identifies an ML path corresponding to the code sequence representing the codeword. The information about the ML path is used to obtain the code sequence representing the decoded codeword, which is subsequently converted to the decoded data.

For a trellis terminated by using a zero-padding technique, the initial metrics in the ASM are set as follows: The first element of the fist column in the ASM corresponds to the zero state, and the metric of the first element is set to a predetermined highest reliability value. The metrics of the remaining elements of the fist column are set to a predetermined lowest reliability value. The first element of the active state list A corresponds to the index of the zero state, namely 0. The rest of the elements in the active state list A are set to a value indicating that the index of the state is 'Not Available.'

After receiving the decoded data, the EDC decoder 340 checks for errors. If no error exists, the decoded data 304 is sent to the next processing unit of the receiving chain of the wireless receiver. If, however, a error is detected, a technique for finding alternative codewords is employed (see step 250). A signal 342 is sent to the alternative codeword generator 350 to find an alternative codeword. Subsequently, the alternative data is fed to the EDC decoder 330 to check for errors. The trace-back process continues until correct data is obtained or the alternative codeword generator 350 exhausts all alternative codewords.

Figure 4:
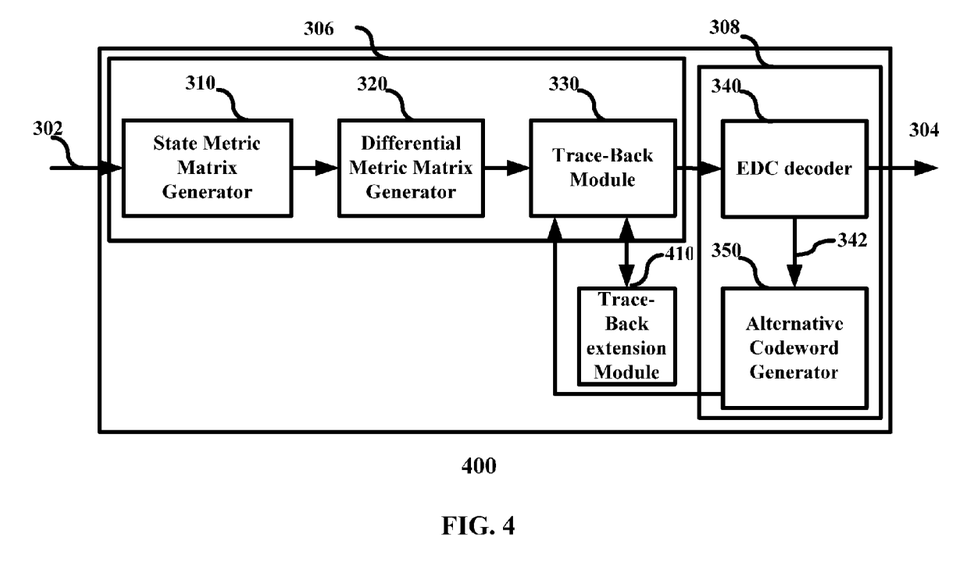
FIG. 4 illustrates a decoding system that employs an ML decoder and an EDC decoder to decode tail-biting trellis codes in accordance with an embodiment of the present invention.

FIG. 4 illustrates a decoding system 400 that employs an ML decoder and an EDC decoder to decode tail-biting trellis codes in accordance with an embodiment of the present invention. The decoding system 400 comprises a trace-back extension module 410, a codeword-decoding module 306 and a data-checking module 308.

For a trellis that is terminated by using a tail-biting technique, its starting state, which is also the ending state, is unknown. Therefore, the initial values of the elements of the active state metric matrix ASM and the active state list A are initialized in such a way that each of the states is likely to be the starting state, i.e. all states have the same predetermined metric.

When the process of decoding the receiving codeword reaches the end of the bit stream 302, the ML decoder repeats the process from the beginning of the bit stream 302 for a predetermined number of time instances $w_{t_j}$, where $w_{t_j}$ is preferred to be bigger than $5 \log_2 S$ and S is the number of states. Afterwards, the trace-back module 330 randomly selects an active state at time instance $t_j$ and runs the trace-back algorithm.

After tracing back $w_{t_j}$ time instances, the trace-back module 330 considers the state that the trace-back path passes through at time instance 0 (if $w_{t_j}$=$5 \log_2 S$) as the starting state of the trellis. Because of the circular nature of tail-biting trellis codes, the ending state of the trellis becomes known after the starting state is identified. The trace-back process continues from the last time instance of the trellis, to the time instance 0 and then an ML path is identified. The part of the simplified trellis diagram between $t_0$ and $t_j$, is traced-back twice by the trace-back extension module 410.

The information about the ML path is used to obtain the code sequence that represents the decoded codeword, which is subsequently converted to the decoded data. Subsequently, the decoded data is forwarded to the data decoding module 308 to verify the integrity of the decoded data. The data-decoding module 308 either obtains correct decoded data or exhausts all the alternative codewords (see step 250).

One way to further reduce system resources required for processing a receiving codeword using the disclosed method is to divide a receiving codeword into segments. Instead of processing the entire receiving codeword, the ML decoder processes the receiving codeword one segment at a time. The processing of a segment of the receiving codeword by the ML decoder is similar to sliding a window of a predetermined size w over the receiving codeword. As a result, the technique is commonly known as a sliding window algorithm.

Figure 5:
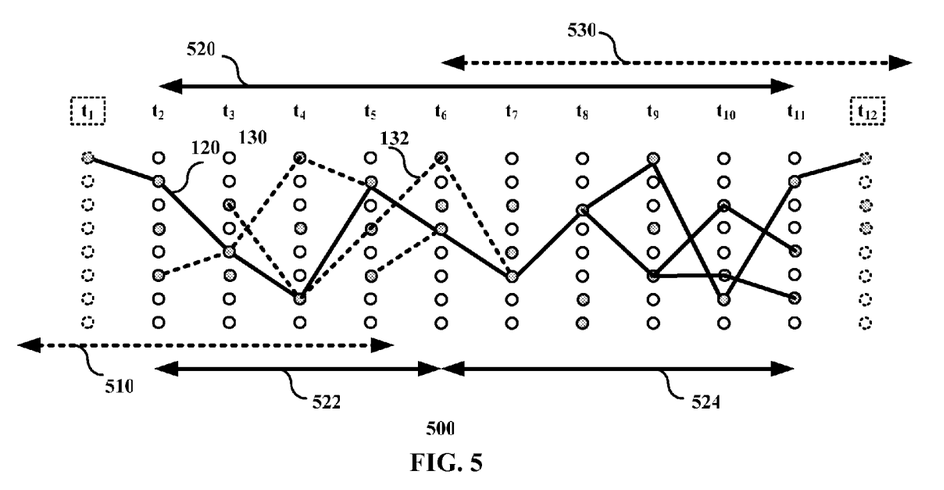
FIG. 5 is a simplified trellis diagram illustrating the decoding process of an ML decoder employing the Viterbi algorithm and a sliding window algorithm in accordance with an embodiment of the present invention.

FIG. 5 is a simplified trellis diagram 500 illustrating the decoding process of trellis code employing the Viterbi algorithm and a sliding window algorithm in accordance with an embodiment of the present invention. A window 520 of a predetermined size w represents a segment of the receiving codeword. Furthermore, the window 520 is partitioned into two: the first sub-window 522, which contains a convergent path, and the second sub-window 524, which contains non-convergent paths. How the window is partitioned may be determined by channel conditions, which are unknown.

The ML path of the receiving codeword comprises convergent paths, each of which is a partial ML path of a window. Ideally, the first sub-window 522 has the same size as the window 520 and the second sub-window 524 has a size of zero. However, in reality, the window 520 always includes a number of non-convergent paths. As a result, the second sub-window 524 must be part of the succeeding window, i.e. any consecutive windows overlap where non-convergence paths are present. Without any prior knowledge about how the window is partitioned, an ML decoder can still produce the best result if the overlapping areas $w_o$ of the consecutive windows has a predetermined size larger than $5 \log_2 S$, i.e. $w_o > 5 \log_2 S$.

In the diagram 500, the current window 520 covers the area between time instances $t_2$ and $t_{11}$. There is an overlapping area of the current window 520 and the preceding window 510. There is also an overlapping area of the current window 520 and the succeeding window 530. The overlapping areas include non-convergent paths.

Figure 6:
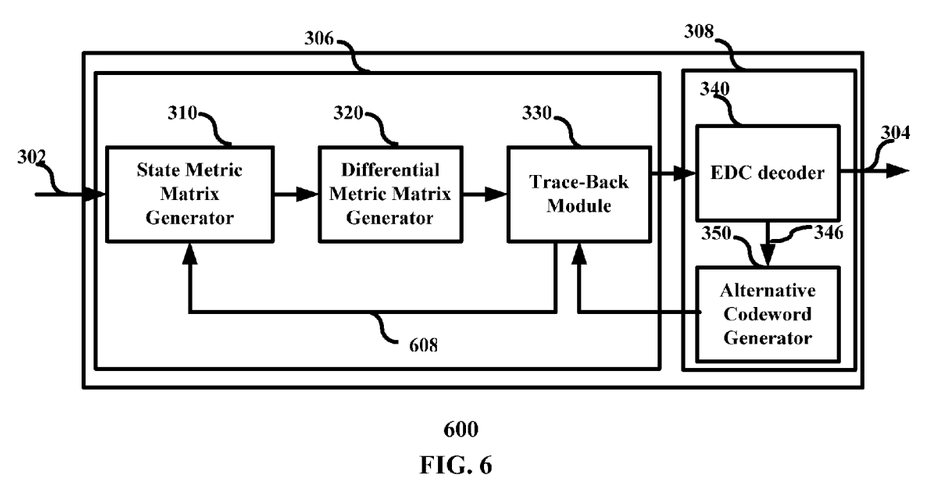
FIG. 6 is a block diagram illustrating a decoding system that employs an ML decoder and an EDC decoder to decode zero-padding trellis codes by using a sliding window algorithm in accordance with an embodiment of the present invention.

FIG. 6 is a block diagram illustrating a decoding system 600 that employs an ML decoder and an EDC decoder to decode zero-padding trellis codes by using a sliding window algorithm in accordance with an embodiment of the present invention. The decoding system 600 comprises a signal path 608, a codeword-decoding module 306 and a data-checking module 308.

The codeword-decoding module 306 operates in the same way as described in FIG. 3. Instead of processing the entire bit stream 302, the codeword-decoding module 306 employing a sliding window algorithm processes one segment of the bit stream 302 at a time and identifies a partial ML path of each window. After a partial ML path is identified, a signal is sent to the state metric matrix generator module 310 to begin processing the next window.

After the entire receiving codeword is processed, the ML path comprising partial ML paths from one or more windows is identified. After the decoded data is obtained, it is forwarded to the data-checking module 308. The data-checking module 308 either obtains correct decoded data or exhausts all the alternative codewords. During the decoding process, it is important not to generate duplicate ML paths in the overlapping areas of the windows.

Figure 7:
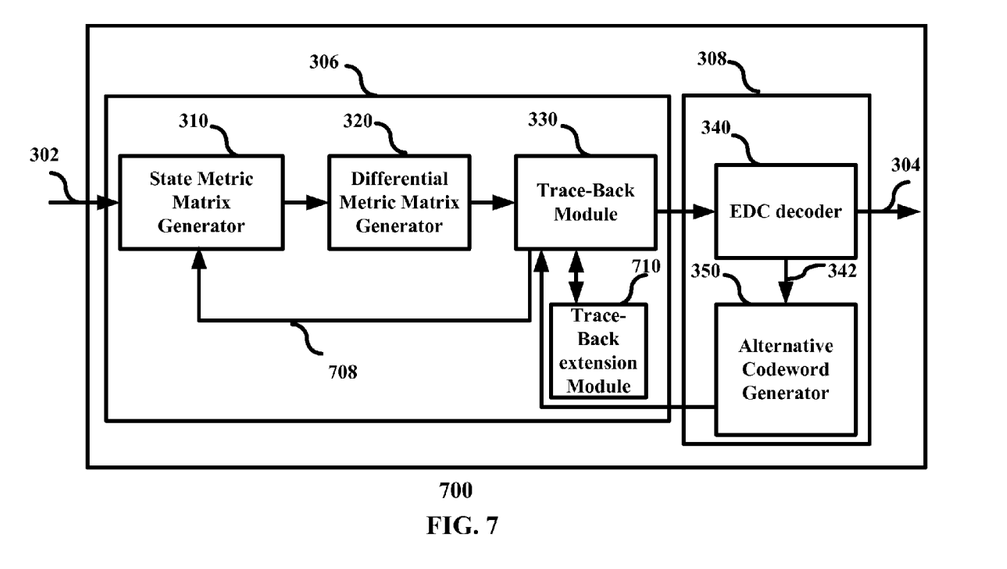
FIG. 7 is a block diagram illustrating a decoding system that employs an ML decoder and an EDC decoder to decode tail-biting trellis codes by using a sliding window algorithm in accordance with an embodiment of the present invention.

FIG. 7 is a block diagram illustrating a decoding system 700 that employs an ML decoder and an EDC decoder to decode tail-biting trellis codes by using a sliding window algorithm in accordance with an embodiment of the present invention. The decoding system 700 comprises a trace-back extension module 710, a signal path 708, a codeword-decoding module 306 and a data-checking module 308.

The trellis in the decoding system 700 is initialized in the same way as the one in the system 400. Processing the receiving codeword by using a sliding window algorithm is completed in the same way as it is for the system 600. When the process of decoding the receiving codeword reaches the end of the bit stream 302, the ML decoder repeats the process from the beginning of the bit stream 302 for a predetermined number of time instances $w_{t_f}$, where $w_{t_f} > 5 \log_2 S$. Afterwards, the trace-back module 330 randomly selects an active state at time instance $t_f$ and runs the trace-back algorithm.

The trace-back extension module 710 traces back the part of the simplified trellis diagram, between $t_0$ and $t_f$, of size $w_{t_f}$ twice. This operation is performed by using the variables M and A that are initialized according to the preceding window.

The trace-back module 330 identifies an ML path that corresponds to the code sequence representing the receiving codeword. The ML path comprises partial ML paths of each window. After the decoded data is obtained, it is forwarded to the data-checking module 308. The data-checking module 308 either obtains correct decoded data or exhausts all the alternative codewords. During the decoding process, it is important not to generate duplicate ML paths in the overlapping area of the windows.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for improving the decoding efficiency in a wireless receiver to obtain a correct decoded data string, the method comprising:

generating a state metric matrix of a received codeword, wherein the state metric matrix comprises state metrics of one or more time instances associated with the received codeword;

calculating a differential metric matrix that represents differences in the metrics for one or more time instances in the state metric matrix;

identifying a maximum likelihood path and one or more alternative paths based on the differential metric matrix;

deriving a first decoded data string corresponding to the maximum likelihood path;

deriving a second decoded data string for each of the one or more alternative paths, respectively;

examining the an integrity the first decoded data string to determine if the first decoded data string is erroneous;

examining the an integrity each of the second decoded data strings if the first decoded data string is determined to be erroneous; and deriving a correct decoded data string based on the first decoded data string and the second decoded data strings.

2. The method of claim 1, and further comprising:

identifying a predetermined number of states of one or more time instances in the state metric matrix that have the most reliable metrics;

generating an active state metric matrix comprising metrics for the predetermined number of states determined to be most reliable for each of the one or more time instances in the state metric matrix; and wherein said calculating the differential metric matrix is based on the metrics in each active state metric matrix.

3. The method of claim 2, wherein calculating the differential metric matrix further comprises:

computing at a time instance one or more metrics for one or more paths that trace one or more states based on the metric information comprised in each active state metric matrix;

selecting a first path with the most reliable metric and a second path with the second most reliable metric in a state at a time instance;

computing the difference between metrics of the first and the second paths that trace the state at the time instance; and storing the difference between metrics of the first and the second paths that trace one or more states at one or more time instances in the corresponding elements of the differential metric matrix.

4. The method of claim 1, wherein identifying the maximum likelihood path and the one or more alternative paths further comprises:

running a trace-back algorithm to identify the maximum likelihood path;

examining one or more state metrics of the differential metric matrix related to the maximum likelihood path;

selecting a predetermined number of states with the smallest metrics related to the maximum likelihood path;

storing indices of the predetermined number of states in a divergence list; and generating the predetermined number of the one or more alternative paths using the divergence list.

5. The method of claim 4, wherein generating the predetermined number of the one or more alternative paths further comprises:
   selecting one or more indices from the divergence list; and
   generating the predetermined number of the one or more alternative paths in the state that corresponds to the selected one or more indices.

6. A decoding system of a wireless receiver that decodes received zero-padding and tail-biting trellis codewords, the system comprising:
   a state metric matrix generator configured to generate a state metric matrix comprising state metrics of one or more time instances of a received codeword;
   a differential metric matrix generator configured to generate and store a difference in metrics for one or more time instances in the state metric matrix;
   a trace-back module configured to identify maximum likelihood path and to derive a first decoded data string;
   an alternative codeword generator configured to identify a predetermined number of one or more alternative paths and to derive one or more alternative decoded data strings, and
   an error detection code decoder configured to determine an integrity of a plurality of second decoded data strings selected from a group comprising the first decoded data string and the one or more alternative decoded data strings to provide a
   correct decoded data string.

7. The system of claim 6, wherein the state metric matrix generator is further configured to calculate the state metrics of one or more time instances, and to generate an active state metric matrix for each of the one or more time instances, a path history matrix, and an active state list, and wherein the differential metric matrix generator is configured to generate the difference in metrics based on the active state metric matrix.

8. The system of claim 7, wherein the state metric matrix generator, after reaching the end of the received tail-biting trellis codeword, is further configured to reprocess the received codeword from the beginning for a predetermined number of time instances.

9. The system of claim 7, wherein the state metric matrix generator is further configured to set the initial metric of a first element of the active state metric matrix for the zero-padding trellis codeword, corresponding to a zero state, to a predetermined highest reliability value.

10. The system of claim 7, wherein the state metric matrix generator is further configured to set the initial metrics of one or more elements, excluding the first element, of the active state metric matrix for the zero-padding trellis codeword, corresponding to non-zero states, to a predetermined lowest reliability value.

11. The system of claim 7, wherein the state metric matrix generator is further configured to set the initial index of a first element in the active state list for the zero-padding trellis codeword corresponding to a zero state.

12. The system of claim 7, wherein the state metric matrix generator is further configured to set the initial indices of one or more elements, excluding the first element, in the active state list for the zero-padding trellis codeword, corresponding to non-zero states to a predetermined value meaning "Not Available".

13. The system of claim 7, wherein the state metric matrix generator is further configured to set the initial metrics of one or more elements of the active state metric matrix for the tail-biting trellis codeword to a predetermined metric.

14. The system of claim 7, wherein the state metric matrix generator is further configured to set the initial indices of one or more elements in the active state list for the tail-biting trellis codeword to a predetermined value.

15. The system of claim 6, wherein the differential metric matrix generator is configured to calculate one or more metrics of one or more paths that trace a state at a time instance, select a first path with the most reliable metric and a second path with the second most reliable metric, compute the difference between metrics of the first and the second paths, and store the difference in the corresponding element of the differential metric matrix.

16. The system of claim 6, wherein the trace-back module further includes a trace-back extension module configured to run a trace-back algorithm at a predetermined time instance in the tail-biting trellis codeword, wherein the predetermined time instance is determined randomly by the trace-back module.

17. A decoding system of a wireless receiver that employs a sliding window technique to decode received zero-padding and tail-biting trellis codewords, the system comprising:
   a state metric matrix generator configured to process received codewords and to calculate state metrics one segment at a time;
   a differential metric matrix generator configured to generate and store a difference in metrics for one or more time instances in the state metric matrix;
   a trace-back module configured to identify a maximum likelihood path and to derive a first decoded data string, and wherein the trace-back module is further configured to generate a signal for requesting the state metric matrix generator to process a subsequent segment;
   an alternative codeword generator configured to identify a predetermined number of one or more alternative paths and to derive one or more alternative decoded data strings, and
   an error detection code decoder configured to determine an integrity of a plurality of second decoded data strings selected from a group comprising the first decoded data string and the one or more alternative decoded data strings to provide a
   correct decoded data string.

18. The system of claim 17, wherein the state metric matrix generator, after reaching the end of a received tail-biting trellis codeword, is further configured to reprocess the received codeword from the beginning for a predetermined number of time instances.

19. The system of claim 17, wherein the trace-back module is further configured to identify the maximum likelihood path comprising one or more partial maximum likelihood paths in the segment.

20. The system of claim 17, wherein the trace-back module is further configured to employ a sliding window technique and further comprises a trace-back extension module configured to run a trace-back algorithm at a predetermined time instance in the tail-biting trellis, wherein the predetermined time instance is determined randomly by the trace-back module.

* * * * *